United States Patent [19]

Winters et al.

[11] 4,226,666
[45] Oct. 7, 1980

[54] ETCHING METHOD EMPLOYING RADIATION AND NOBLE GAS HALIDE

[75] Inventors: Harold F. Winters, San Jose, Calif.; Brian N. Chapman, Mahopac, N.Y.

[73] Assignee: International Business Machines Corporation, Armonk, N.Y.

[21] Appl. No.: 934,734

[22] Filed: Aug. 21, 1978

[51] Int. Cl.² .............................................. H01L 21/306
[52] U.S. Cl. .................................... 156/643; 156/646; 156/654; 156/657; 156/662; 204/192 E; 219/121 EM; 252/79.1; 250/492 A; 250/492 B; 430/297
[58] Field of Search .............. 156/635, 643, 646, 656, 156/657, 662, 654; 96/36; 423/262, 489; 252/79.1; 204/192 E, 164; 219/121 EM; 250/492 A, 492 B

[56] References Cited

U.S. PATENT DOCUMENTS

| | | | |
|---|---|---|---|
| 3,095,332 | 6/1963 | Wigenza | 156/646 |
| 3,122,463 | 2/1964 | Wigenza et al. | 156/646 |
| 3,183,061 | 5/1965 | Claassen et al. | 423/262 |
| 3,192,016 | 6/1965 | Malm | 423/262 |
| 3,364,087 | 1/1968 | Solomon et al. | 156/646 |
| 3,377,136 | 4/1968 | Morrow | 423/262 |
| 3,489,564 | 1/1970 | Schaefer | 96/36 |
| 3,494,768 | 2/1970 | Schaefer | 156/635 |
| 3,520,685 | 7/1970 | Schaefer | 96/36 |
| 3,615,956 | 10/1971 | Irving et al. | 156/662 |
| 3,637,381 | 1/1972 | Hallmann et al. | 156/643 |
| 3,699,334 | 10/1972 | Cohen et al. | 250/492 B |
| 3,795,557 | 3/1974 | Jacob | 156/662 |
| 3,866,398 | 2/1975 | Vernon et al. | 156/643 |
| 4,028,155 | 6/1977 | Jacob | 156/643 |
| 4,092,210 | 5/1978 | Hoepfner | 219/121 EM |

FOREIGN PATENT DOCUMENTS

| | | | |
|---|---|---|---|
| 4631931 | 9/1967 | Japan | 156/643 |
| 5119975 | 8/1974 | Japan | 250/492 A |
| 5127833 | 9/1974 | Japan | 156/643 |

OTHER PUBLICATIONS

Desilets et al., "Reactive Spiecies . . . Compound," *IBM Technical Disclosure Bulletin* vol. 22, No. 1, (6/79) pp. 111-112.
Hiraoka, "Ion Beam . . . HCl," *IBM Technical Disclosure Bulletin* vol. 22, No. 2, (7/79), p. 773.

*Primary Examiner*—Jerome W. Massie
*Attorney, Agent, or Firm*—Pollock, Vande Sande & Priddy

[57] ABSTRACT

A method for etching using radiation and a gas.

31 Claims, 3 Drawing Figures

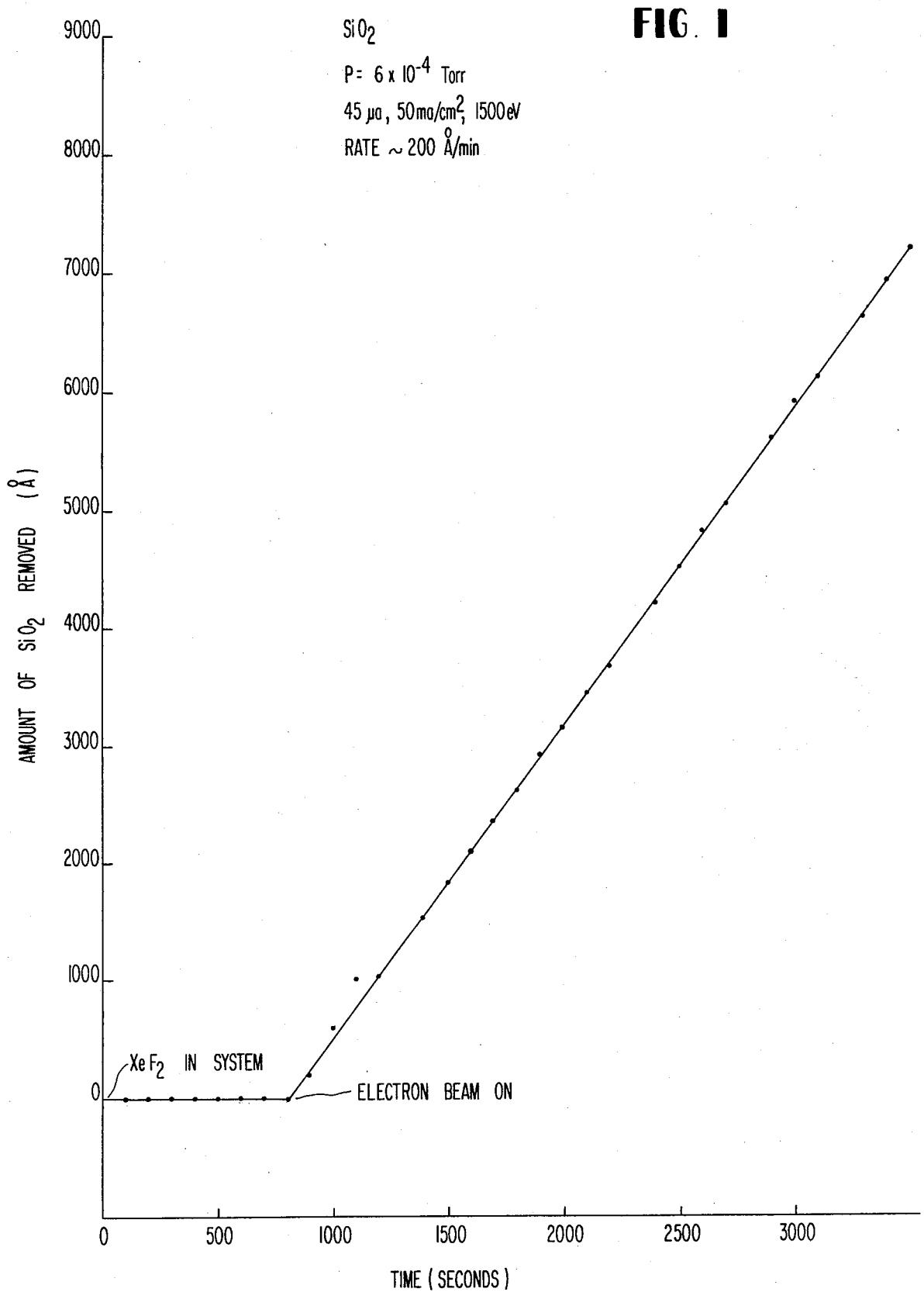

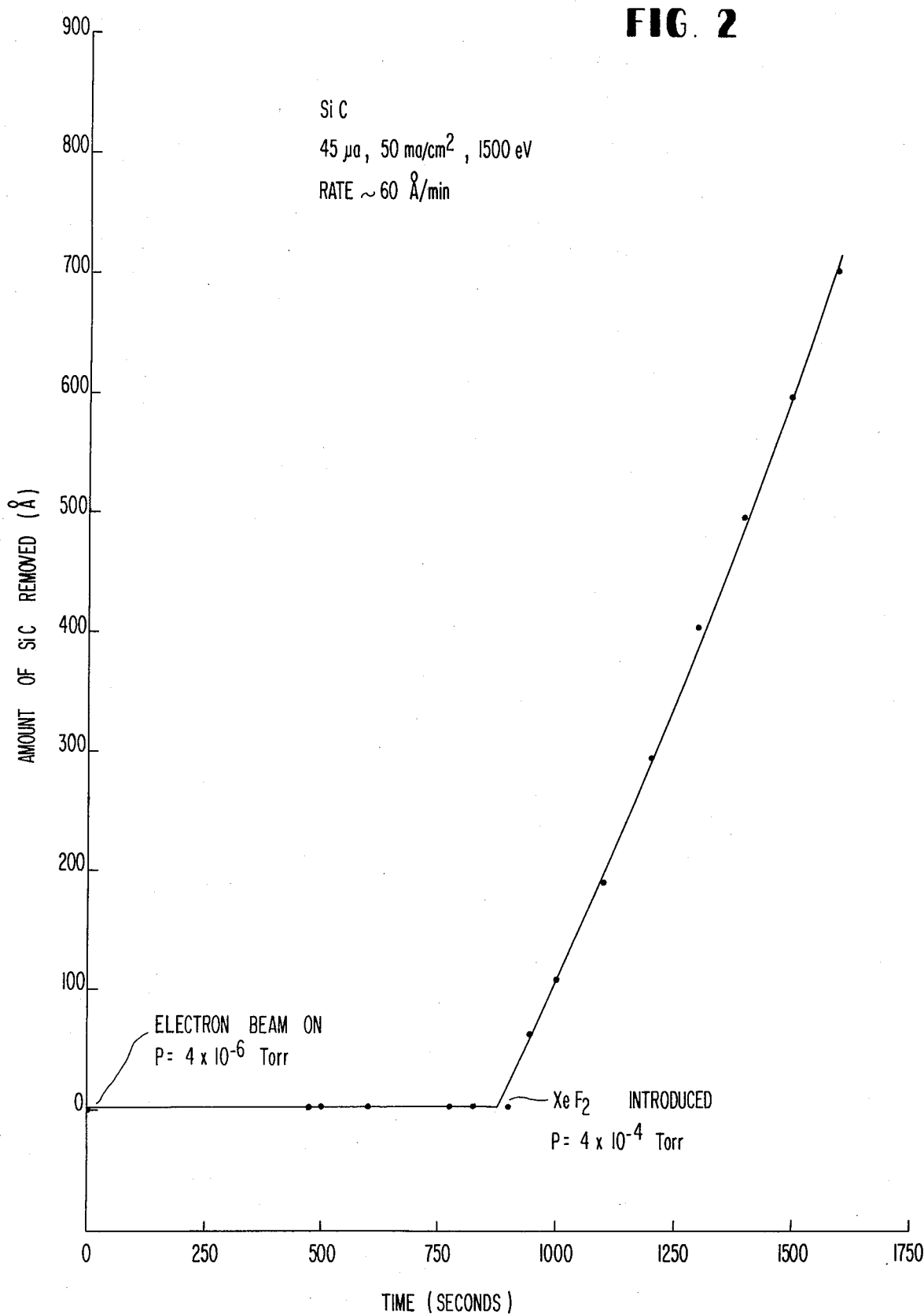

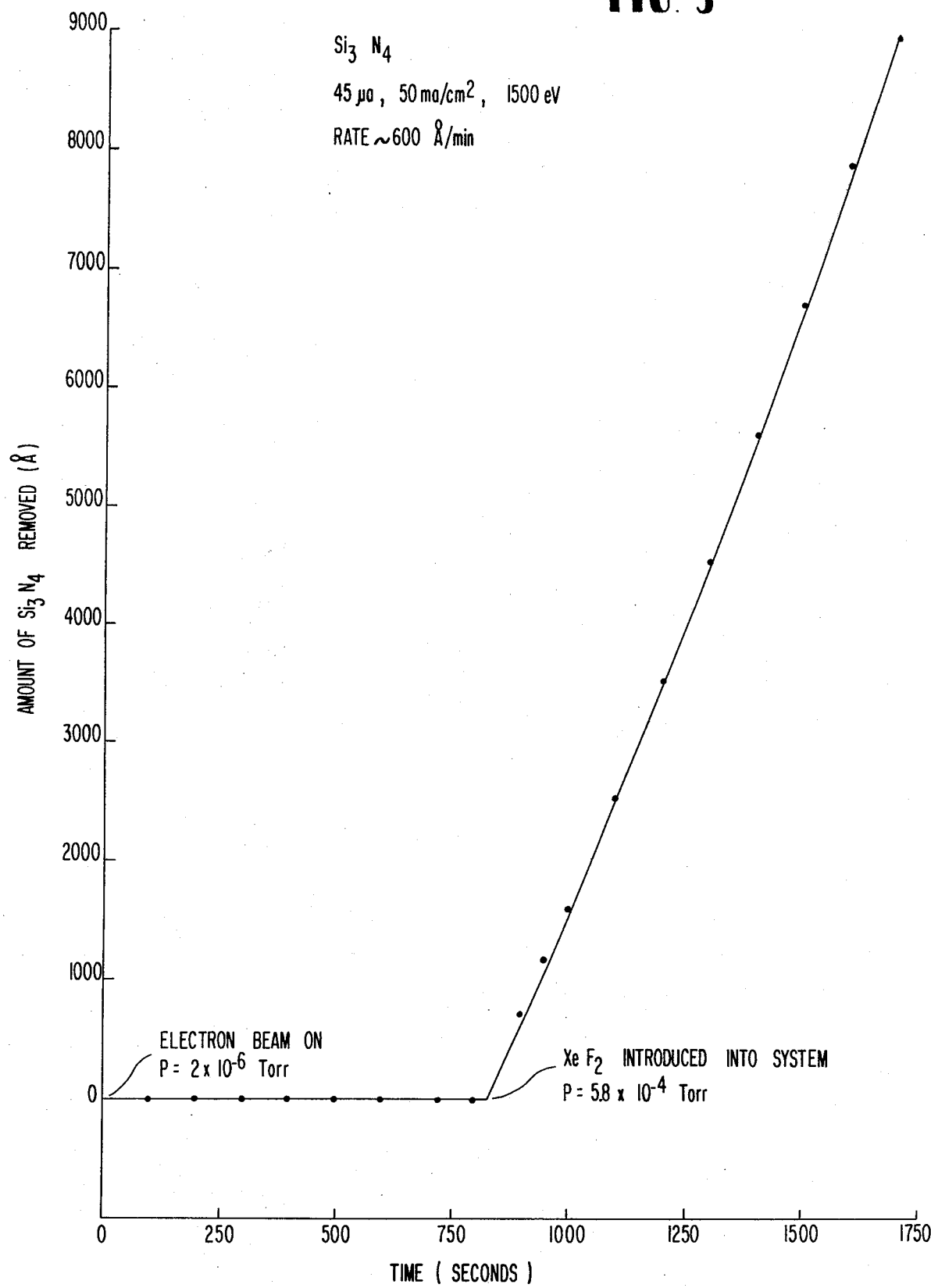

ETCHING METHOD EMPLOYING RADIATION AND NOBLE GAS HALIDE

DESCRIPTION

1. Technical Field

The present invention is concerned with the etching of a surface and is particularly concerned with the use of radiation and a gas.

It is an object of the present invention to provide a method for etching which is capable of etching such materials as silicon oxides, silicon nitrides, silicon carbides, and silicon oxynitrides.

It is another object of the present invention to provide a process for etching using electron beam radiation as well as ion beam radiation, which does not require any additional steps after the exposure to the electron beam and/or ion beam radiation in order to achieve etching.

2. Description of Prior Art

In the manufacture of various items such as semiconductor chips or devices, a number of etching steps are required. In fact, in the manufacture of semiconductor chips, the steps of etching different layers which constitute the finished chip are among the most critical and crucial steps.

An etching method concerned with the use of noble gas halides as the etchant is described in U.S. Pat. application Ser. No. 934,731 to Harold F. Winters entitled "Etching Method Using Certain Halides" filed concurrently herewith. Excellent etch rates were obtained by employing noble gas halides according to the procedure of said U.S. patent application on surfaces etched. However, it was noted that silicon oxide was not substantially etched with noble gas halides under the conditions of temperature and pressure employed.

The use of electron beam radiation in the fabrication of patterned devices such as integrated circuits is well known. The use of electron beam radiation normally involves exposing a coating of an electron resist such as a polymer which is either degradable when exposed to electron beam radiation (i.e., a positive electron beam resist) such as polymethyl methacrylate or hardenable (e.g., crosslinkable) when exposed to electron beam radiation (i.e., a negative electron beam resist). When using a positive resist, the coating is exposed to the electron beam radiation in a predetermined pattern in order to degrade the polymer to lower molecular weight products. Then the degraded products are removed in the exposed areas such as by use of a solvent which is capable of dissolving the degraded polymer but not capable of dissolving the unexposed portions of the coating. The technique using a negative resist is similar except that the coating in the unexposed areas is removed. These methods require an additional process step (e.g., use of a solvent) after the exposure to the electron beam radiation to achieve etching.

BRIEF DESCRIPTION OF THE DRAWINGS

FIG. 1 illustrates the etch rates at the stated conditions for $SiO_2$.

FIG. 2 illustrates the etch rate at the stated conditions for SiC.

FIG. 3 illustrates the etch rate at the stated conditions for $Si_3N_4$.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

The present invention is directed to a method for etching a surface. One aspect of the present invention is a process which includes exposing the surface to be etched both to at least one noble gas halide and to radiation at about the same time for a time sufficient to etch the surface to the desired extent.

The present invention is also directed to exposing a surface to be etched to electron beam and/or ion beam radiation and reactive vapors at about the same time in a predetermined pattern for a time sufficient to etch the surface to the desired extent.

BEST MODE FOR CARRYING OUT THE INVENTION

The surfaces which are etched according to the present invention are preferably those surfaces which are not etchable at ordinary room temperature or below employing noble gas halides. The surface to be etched is preferably one wherein all the components of it are capable of forming volatile substances under the conditions of the etching process. Examples of some suitable materials include oxides, nitrides, oxynitrides, and carbides and particularly silicon oxides (e.g., $SiO_2$ and $SiO$), silicon nitrides, silicon oxynitrides, and silicon carbides.

The present invention is particularly beneficial for etching patterned articles. For instance, the present invention is especially useful in etching patterns into substrates of silicon, polycrystalline silicon and various metals such as titanium, tantalum and molybdenum. For instance, a layer of an oxide, nitride, oxynitride, and/or carbide could be provided on a substrate. Then portions of the layer of for example oxide or the like could be exposed to radiation and the reactive gas in a predetermined pattern with sufficient exposure to degrade and remove the oxide layer or the like in the exposed area. Those portions of the layer of oxide or the like not exposed to the electron beam radiation would not be removed.

Next, the radiation could be turned off and the now exposed underlying layer of silicon or other material would then be exposed to the reactive gas such as a noble gas halide and would be etched. Those portions of the silicon layer or the like which are under the oxide layer or the like would not be exposed to the noble gas halide and accordingly would not be etched. In such a process, the substrate is preferably one wherein all the components of it are capable of forming volatile substances under the conditions of the etching process.

In order to effect etching of the materials of the present invention, such must be exposed to a degrading type of radiation at about the same time it is exposed to a reactive vapor or gas.

The radiation employed can be electron beam radiation, ion beam radiation, nuclear radiation, and actinic light. Actinic light includes any electromagnetic wave in the range of X-ray up to infrared, and usually up to ultraviolet. Preferably the radiation employed is electron beam radiation or ion beam radiation, and most preferably is electron beam radiation. More than one type of radiation can be employed, if desired.

The specific exposure flux of the radiation will normally be dependent upon the specific material selected and upon the thickness thereof. Generally, for electron beam exposure of surfaces in thicknesses of about 50 angstroms to about 10 microns, electron beam radiation from about $10^{-2}$ coulombs/cm$^2$ to about $10^4$ coulombs/cm$^2$ and at an energy of about 100 eV to about 50 keV are employed.

When the radiation employed is an electron beam or ion beam for patterned etching, the etchant can be any material which includes at least one reactive gaseous constituent which is adsorbed on the surface of the material to be etched, does not leave any nonetchable residue from it on the surface after the etching, and reacts with the surface to form gaseous products which desorb from the surface. The etchant employed is one which forms only gaseous constituents under the etching conditions. Moreover, the etchant should be a material whose etching characteristics are activated or greatly enhanced by the presence of radiation under the pressures and temperatures to be employed.

The preferred etchants employed, along with electron beam and/or ion beam radiation according to the present invention, are noble gas halides and most preferably fluorides or chlorides of noble gases. The noble gas is preferably krypton, xenon, or radon and is most preferably xenon. The etchants are selected such that they are not reactive with the walls of the reactor but are reactive upon the surface to be etched under the conditions of the process in the presence of radiation forming gaseous products. In addition, the surface to be etched is one wherein components thereof form volatile halides which are inherently desorbed from the surface of the substrate. It is believed that the radiation induces reaction of the reactive gas species at the surface of the material being etched in those locations actually contacted by the radiation. The etchant employed can contain other constituents either in admixture or in chemical combination thereof so long as such do not adversely affect the function of the reactive noble gas halides to an unacceptable or undesired extent, and should not leave residue on the surface being etched. It is noted that the noble gas halides will inherently contain some quantities of free noble gas. Various noble gas halides suitable for the present invention are well known as exemplified by U.S. Pat. Nos. 3,192,016 to Malm et al; 3,326,638 to Cleaver; and 3,377,136 to Morrow.

The preferred halide etchants employed with electron beam and/or ion beam radiation according to the present invention include XeF$_2$, XeF$_4$, XeF$_6$, KrF$_2$, KrF$_4$ and KrF$_6$ with the most preferred etchant being XeF$_2$. Mixtures of noble gas halides can be used if desired. The halide etchants employed according to the present invention during the process provide reactive halogen species and only components in the gas phase.

When a source of radiation other than electron beam or ion beam is employed, the etchant is at least one of the noble gas halides described hereinabove. It is quite surprising that the combination of a noble gas halide and radiation provide for the type of etching achieved according to the present invention. In particular, as discussed hereinabove, the use of the noble gas halide alone at the temperature employed herein did not provide any noticeable etching of SiO$_2$ or SiC or Si$_3$N$_4$. In addition, the use of radiation alone such as electron beam radiation under the conditions employed herein did not provide any noticeable etching.

With respect to the use of light radiation and certain gases, U.S. patents 3,095,332 to Ligenza, 3,095,341 to Ligenza, and 3,122,463 to Ligenza and Shapiro suggest using IF$_5$, NF$_3$ and Br$_2$ mixtures, and F$_2$O, respectively. However, these patients fail to suggest the use of noble gas halides and the use of electron beam radiation and/or ion beam radiation.

The process of the present invention is generally carried out employing halides and the use of electron beam radiation and/or ion beam radiation.

The process of the present invention is generally carried out under vacuum particularly when employing electron beam or ion beam radiation and more usually at pressures of about $10^{-5}$ torr to about $10^{-2}$ torr.

The minimum flow rate of the etchant is generally determined by the desired etch rate. The maximum flow rate is primarily determined by the capacity of the pumping system.

The process of the present invention is generally carried out at normal room temperatures (e.g., about 300° K.) or less. Higher temperatures can be employed when desired.

The apparatus employed which comes into contact with both the etchant and radiation can be constructed of any material which is not attacked by the etchant under the influence of radiation such as stainless steel and Monel. Electron beam apparatus is well known and need not be described herein.

The following nonlimiting examples are provided to further illustrate the present invention.

EXAMPLE 1

An SiO$_2$ film of about 2 micron thickness on a quartz crystal microbalance is placed in a vacuum system and exposed to XeF$_2$ at a total pressure of $6 \times 10^{-4}$ torr. for about 800 seconds. No etching is observed. An electron beam of 1500 eV and about 50 ma/cm$^2$ was then activated and etching was immediately observed. Etching is not observed under electron irradiation without XeF$_2$.

INDUSTRIAL APPLICABILITY

Several other films that may be etched are described in the following examples.

EXAMPLE 2

An SiC film of about 1 micron thickness on a quartz crystal microbalance is introduced into a vacuum chamber at a pressure of about $4.1 \times 10^{-6}$ torr of background gas and is exposed to the same electron beam radiation as used in Example 1. The pressure remained at this point for the first 850 seconds after which XeF$_2$ is introduced to a pressure of about $4.1 \times 10^{-4}$ torr. At this point the slope changes dramatically caused by etching of the SiC. The temperature employed is about 300° K. The etch rate as illustrated in FIG. 2 is about 60 angstroms per minute. Only those locations on the SiC actually exposed to the radiation are etched.

EXAMPLE 3

A Si$_3$N$_4$ film of about 1 micron thickness on a quartz crystal microbalance is introduced in a vacuum chamber at a pressure of about $2 \times 10^{-6}$ torr of background gas and is exposed to the same electron beam radiation as used in Example 1 (i.e., dose of about 300 coulombs/cm$^2$ at about 1500 eV and about 50 ma/cm$^2$).

The pressure remained at $2 \times 10^{-6}$ torr for the first 800 seconds after which XeF$_2$ is introduced to a pressure of about $5.8 \times 10^{-4}$ torr. At this point, the slope changes dramatically caused by etching of Si$_3$N$_4$. The temperature employed is about 300° K. The etch rate as illustrated in FIG. 3 is about 600 angstroms/minute. Only those locations in the Si$_3$N$_4$ exposed to the radiation are etched.

From the above examples it is apparent that the radiation alone did not cause etching of the surfaces. In addition, the etch rates are much too fast to be accounted for by collisions between gas phase molecules and electrons. Therefore, it is believed that etching is probably caused by the breaking of surface bonds at the result of electron impact.

Since the etching can be activated by radiation, the shape of etched walls is readily controllable. The ability to etch patterns with electron beam activation provides for fabricating patterned devices even without the use of contact masks. The term "patterned etching" and like terms as used herein refer to etching less than the entire surface of the material being etched in predetermined location or locations and includes etching just one point in the surface.

Having thus described our invention, what we claim as new, and desire to secure by Letters Patent is:

1. A method for etching a surface wherein all of the constituents of the surface are capable of forming volatile substances which comprises exposing the surface to be etched to at least one noble gas halide and to radiation selected from the group of ion beam radiation, electron beam radiation, nuclear radiation, actinic light, and mixtures thereof at about the same time for a period of time to etch the surface to the desired extent.

2. The method of claim 1 wherein said halide is a fluoride.

3. The method of claim 1 wherein said noble gas halide is a fluorinated xenon compound.

4. The method of claim 1 wherein said noble gas halide is selected from the group of XeF$_2$, XeF$_4$, XeF$_6$, KrF$_2$, KrF$_4$, KrF$_6$, and mixtures thereof.

5. The method of claim 1 wherein said noble gas halide is XeF$_2$.

6. The method of claim 1 wherein said surface is a silicon dioxide.

7. The method of claim 1 wherein said surface is silicon nitride.

8. The method of claim 1 wherein said surface is silicon carbide.

9. The method of claim 1 wherein the etching is carried out under vacuum.

10. The method of claim 1 wherein the etching is carried out at a pressure of about $10^{-5}$ torr to about $10^{-2}$ torr.

11. The method of claim 1 wherein said same source of radiation is ion beam radiation.

12. The method of claim 1 wherein said source of radiation is electron beam radiation.

13. The method of claim 12 wherein said halide is a fluoride.

14. The method of claim 12 wherein said noble gas halide in a fluorinated xenon compound.

15. The method of claim 12 wherein said noble gas halide is selected from the group of XeF$_2$, XeF$_4$, XeF$_6$, KrF$_2$, KrF$_4$, KrF$_6$, and mixtures thereof.

16. The method of claim 12 wherein said noble gas halide is XeF$_2$.

17. The method of claim 1 wherein the etching is carried out at about or below normal room temperature.

18. The method of claim 9 wherein the etching is carried out at about or below normal room temperature.

19. The method of claim 10 wherein the etching is carried out at about or below normal room temperature.

20. The method of claim 1 which includes patterned etching.

21. The method of claim 20 wherein said patterned etching is carried out in the absence of contact masks.

22. The method for etching a surface wherein all of the constituents of the surface are capable of forming volatile substances which comprises exposing the surface to be etched to electron beam radiation and reactive vapors of an etchant at about the same time under vacuum in a predetermined pattern to etch predetermined portions of the surface to the desired extent, and wherein the etchant includes at least one reactive gaseous constituent which is adsorbed on the surface to be etched, does not leave any non-etchable residue from it on the surface after the etching, and reacts with the surface to form gaseous products which desorb from the surface into the gaseous phase.

23. The method of claim 22 wherein said surface is about 50 angstroms to about 10 microns thick and wherein said radiation is electron beam radiation from about $10^{-2}$ coulombs/cm$^2$ to about $10^4$ coulombs/cm$^2$ at an accelerating potential from about 100 V to about 50 kV.

24. The method of claim 22 wherein said surface is a silicon dioxide.

25. The method of claim 22 wherein said surface is silicon nitride.

26. The method of claim 22 wherein said surface is silicon carbide.

27. The method of claim 22 wherein the etching is carried out at a pressure of about $10^{-5}$ torr to about $10^{-2}$ torr.

28. The method of claim 27 wherein the etching is carried out at about or below normal room temperature.

29. The method of claim 22 wherein the etching is carried out at about or below normal room temperature.

30. The method of claim 22 which includes patterned etching.

31. The method of claim 30 wherein said patterned etching is carried out in the absence of contact masks.

* * * * *